United States Patent [19]
Curtice

[11] 4,114,051
[45] Sep. 12, 1978

[54] TRIGGERED BURST GENERATOR

[75] Inventor: Walter Richard Curtice, Princeton Jct., N.J.

[73] Assignee: RCA Corporation, New York, N.Y.

[21] Appl. No.: 792,418

[22] Filed: Apr. 29, 1977

[51] Int. Cl.² ............................................. H03K 4/00
[52] U.S. Cl. ................................ 307/260; 307/281; 328/56; 328/59; 328/65
[58] Field of Search .................. 307/260, 281, 225 R; 328/65, 66, 56, 59; 333/20; 331/166, 173

[56] References Cited

U.S. PATENT DOCUMENTS

| 3,418,604 | 12/1968 | Ross | 333/20 |
| 3,641,371 | 2/1972 | Cartwright | 307/260 |
| 3,764,830 | 10/1973 | Blore et al. | 307/281 |

Primary Examiner—Stanley D. Miller, Jr.
Assistant Examiner—B. P. Davis
Attorney, Agent, or Firm—H. Christoffersen; Joseph D. Lazar

[57] ABSTRACT

A pulse train generator is formed of a series of cascaded stages, each of which operates in response to pulses to generate twice as many output pulses with the same spacing and height. Each stage is formed of a transmission line network and a MESFET amplifier. The input gate of each MESFET is shunted by a matching resistor while the output of the MESFET is coupled to the transmission line network through the drain terminal. The transmission line network is substantially matched to the combined impedance of the load resistor and the MESFET. The generator may be arranged to generate radio frequency waveforms.

22 Claims, 4 Drawing Figures

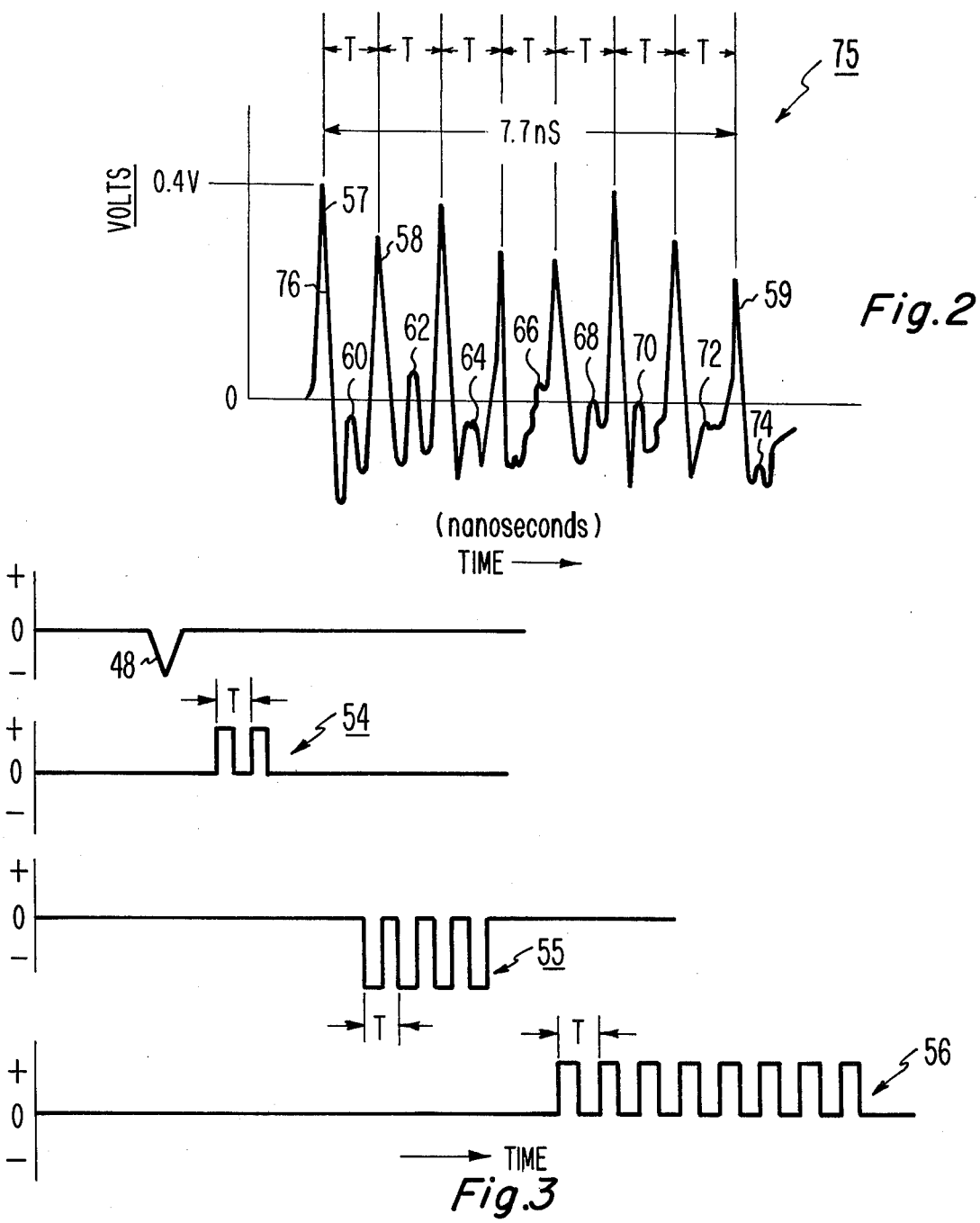
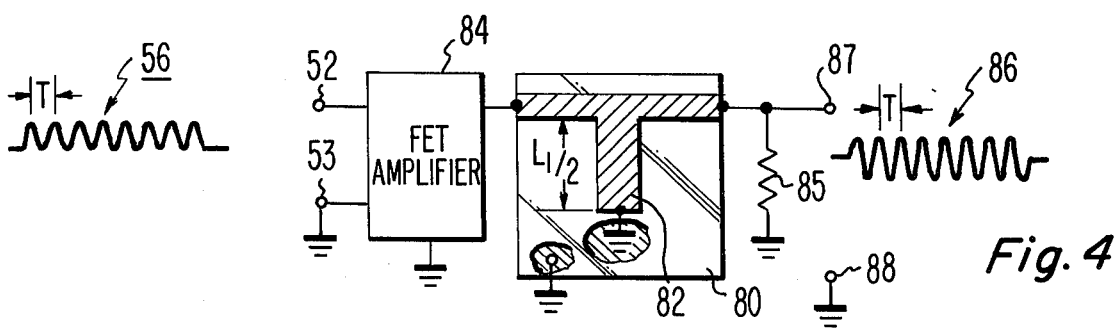

TRIGGERED BURST GENERATOR

The government has rights in this invention pursuant to Contract No. N00039-75-C-0225 awarded by the U.S. Department of the Navy.

BACKGROUND OF THE INVENTION

1. Field of the Invention

The present invention relates to signal generators and in particular to startable signal generators of high accuracy.

2. Description of the Prior Art

Precise interval measurements are essential in nuclear and ballistic time-of-flight tests, radar ranging and in the characterization of active components, such as integrated circuits. In making such interval measurements, utilization of a pulse train of short duration pulses with accurately controlled interpulse spacing is desirable for use with digital signal processing equipment.

The basic principles of generating microwave signals are well known. It has been proposed to use series and parallel pulse forming networks for the generation of microwave signals. Particular forms of network configurations of both series and parallel forms are described in an article by Jerald F. Ross in the Microwave Journal, September 1967, pages 98-105. In the proposal by Ross, a series network comprising T-connections of transmission lines utilizing coaxial lines and T-networks of open circuited and short circuited stubs are used to generate the microwave signals. However, in such series networks and other similar arrangements known in the art, the size of the systems tend to be unnecessarily larger than desired because of reflections due to mismatching of the transmission lines and the pulse forming networks. In addition, the Ross technique results in very large insertion loss. There is a need in the field of pulse generators of high frequency to provide significantly compact structures that are reliable and accurate with low insertion loss.

BRIEF DESCRIPTION OF THE DRAWING

FIG. 2 is a diagram of the waveforms of a clock pulse burst generated in accordance with the invention.

FIG. 3 is a diagram of pulse waveforms used or generated by the pulse train generator.

FIG. 4 is a schematic diagram of another embodiment of the invention for generating RF signals.

DETAILED DESCRIPTION OF THE PREFERRED EMBODIMENT

Figure 1:
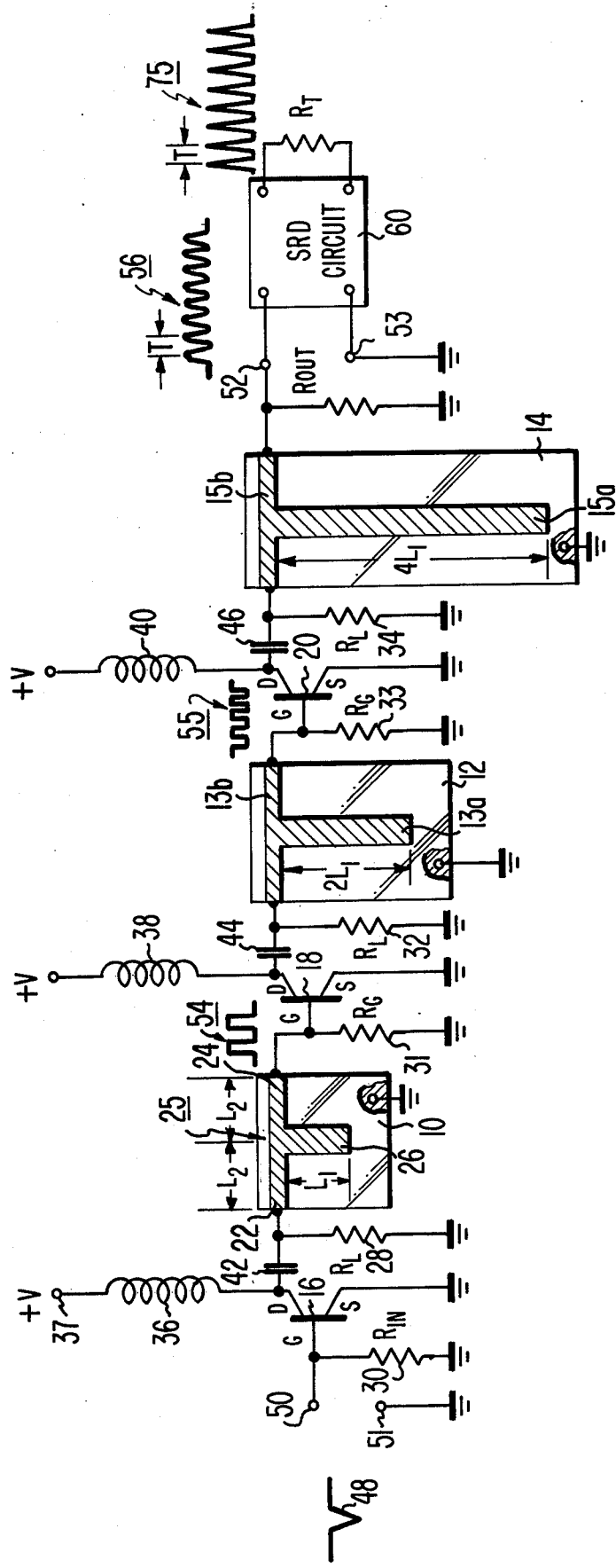
FIG. 1 is a schematic diagram of a pulse train generator embodying the present invention.

Referring to the drawing, the pulse train generator shown in FIG. 1 is formed of a cascaded arrangement of transmission line networks 10, 12, 14 with an input circuit to each comprising respectively, transistors 16, 18, and 20.

Transistors 16, 18, and 20 are preferably gallium arsenide metal-semiconductor field effect transistors typically identified as GaAs MESFET. See an article entitled "Gallium Arsenide Spawns Speed" published in the IEEE Spectrum, March 1977, pages 41-47. Hereinafter the preferred transistor will be indicated as "FET" to simplify the description. Any suitable FET or bipolar transistor, however, may be used in the practice of this invention. The transistor must be capable of providing gain of signals in the gigahertz (GHz) range. In particular, the transistor must be thus capable of sub-nanosecond rise times to generate signals in the gigahertz range.

Each transmission line network is formed of a main transmission line portion of characteristic impedance $Z_0$ and a shunt line portion of impedance $Z_0/2$. For compactness, the network is preferably a microstrip design such as described in the Interim Technical Report: "Microwave Frequency Memory Using GaAs Transferred-Electron Devices," by W. R. Curtice, Contract No. N00014-74-C-0371, Dec. 20, 1974. However, the network may be formed of coaxial lines, coplanar waveguide or any other suitable type of transmission lines with low losses as will be understood by those skilled in the art from the description to follow herein.

Each FET 16, 18, and 20 has a gate (G), source (S), and drain (D) electrode and is connected in the manner as shown. Each of the networks 10, 12, and 14 is formed on a microstrip base having a metallic conductor portion such as portions 22, 24, and 26 forming the network 10, each of the legs of the network having a predetermined length $L_2$ and $L_1$. Portions 22 and 24 comprise the main transmission line portion 25 and portion 26 forms the shunt portion.

The first transmission line network 10 has a stub length $L_1$ for leg 26 that is open and has a characteristic impedance which is one half that of the main line 25 of the network. The junction of leg 26 with the main line 25 will have a voltage reflection coefficient of one half and will produce two output pulses of one half the height of the input pulse applied to the leg 22. Furthermore, the spacing T (in FIG. 3 to be explained) between these two output pulses 54 will be $2L_1/V$ where V is the velocity of the pulse on the stub line 26. Such a network is described in the aforementioned Microwave Journal article by Ross. For this application, it is desirable to make $L_2 \approx VT/4$. The value of $L_2$ should not be much less than $VT/4$ for otherwise the reflection from the junction of the network back to the preceding transistor will occur during the time the pulse from the transistor is being applied to the network. This type of reflection adversely affects the amplitude of the output pulses from the network. Furthermore, if $L_2$ is larger than $VT/4$ but still less than $VT/2$, then a reflection will occur that will distort the second pulse of pulses 54. If $L_2$ is equal to $VT/2$, then maximum distortion will occur since the reflection will occur at the same time as the second pulse of pulses 54 is applied to the network. Accordingly, by arranging $L_2$ to be equal to or approximately equal to $VT/4$, then the reflection will occur substantially midway between the pulses whether there be two or more pulses. The reflections that occur from the input of the next stage back to the output of the network, are likewise controlled by making the value of $L_2 \approx VT/4$ for the similar reasons.

Such reflections as actually observed in an experimental mode of the circuit are indicated on FIG. 2 by the final clock pulse train 75 generated across terminating resistor $R_T$. These reflections are illustrated by the wave portions 60, 62, 64, 66, 68, 70, 72, and 74.

The portions of the wave train 75 shown that extend substantially in the negative region of FIG. 2 are due to extraneous ringing effects due to mismatching and component imperfections. The uneven amplitude of the pulses 57, 58, 59, etc. are caused most likely by multiple reflections in the several networks of the cascaded circuit. It should be appreciated that in this experimental circuit the components selected were not necessarily of optimum construction or quality.

The voltage gain of FET stage 16 is approximately $g_m R_L Z_0/(R_L + Z_0)$ where $g_m$ is the transconductance of FET 16, $R_L$ is the resistance of load resistor 28 and $Z_0$ is the characteristic impedance of the transmission line portion 22.

The gain of stage 16 is arranged to be larger than two to compensate for the factor-of-two loss in the network 10. This increased gain is achieved by arranging the impedance $Z_0$ of transmission line portion 22 to be much larger than 50 ohms such as, for example, 100 ohms. Such a transmission line impedance is realizable within the skills known in the art by the use of alumina substrate microstrips. Such microstrips utilize a base comprising alumina which has a high relative dielectric constant of about nine. The design of such microstrips is described by Schneider in the Bell System Technical Journal, Volume 48, pages 1421-1444, May—June, 1968.

The second stage comprising FET 18 and network 12 is designed in a similar manner but the length of the open stub portion 13a is $2L_1$, i.e., it is twice the length ($L_1$) of the open stub portion 26 of the network 10. This arrangement will cause an output which will have four pulses (55), each such pulse spaced from the next adjacent pulse by the time period T. The third stage comprising FET 20 and network 14 is provided with a length $4L_1$ of stub portion 15a and so forth for additional stages as may be required.

The gate terminal (G) of each of the FETs is shunted with a resistor 30 for the first stage, resistor 31 for the second stage, and resistor 33 for the third stage. Also an RF choke coil 36 couples the supply voltage at terminal 37 to the drain of FET 16 and RF coils 38 and 40 are similarly provided for FET's 18 and 20. While an RF coil is preferably to couple d.c. power to the transistors, a large resistor may be used with, however, a compromise in the gain and power loss in the stage. Furthermore, it will be appreciated that an RF coil may be provided as a discrete element in a hybrid circuit. A coupling capacitor 42 is provided between the drain (D) and the input to network 10. In a similar fashion, capacitors 44 and 46 are provided between the d.c. source and the networks between the respective stages of the respective second and third stages. Each FET 18, 20 may be provided with respective gate resistors ($R_g$), if desired, such as resistor (31) coupled between gate G and a point of reference potential (ground) to improve the frequency response and minimize the reflection from the gate G. Typically, the value of the $R_G$ resistor 31 is equal to the impedance $Z_0$ of line portion 24. Nevertheless, there will tend to be a mismatch at the gate G of FET 18 due to the inherent capacitance of the gate to ground. It should be appreciated that the input resistor ($R_{IN}$) 30 is matched to the impedance of the pulse source coupled to terminals 50, 51. The output of each FET is not matched to the impedance of the following transmisson line input portion. Instead, the combined impedance of the load resistor ($R_L$) connected in parallel with the FET drain (D) is made to be about equal to the characteristic impedance $Z_0$ of the input portion (22, etc.) of the corresponding network. This minimizes the reflection of pulses from the drain (D) of the FET back to the following network.

In operation, an input pulse 48 is applied to the terminals 50 and 51, amplified through FET 16 and applied to the network 10, network 10 having an open circuited section 26 which is one half of the characteristic impedance of the main line 25 of network 10. At the output of network 10, there will be provided a first pulse at one half the network input voltage and a second pulse of the same amplitude namely at one half the voltage delayed by the period T as indicated above. The respective derived output pulses are one half the amplitude of the input pulse because of the impedance relation of the main line portion to the stub portion as discussed by Ross in his aforementioned article. The two output pulses 54 produced by the first stage in response to pulse 48 are also shown in the pulse diagram FIG. 3. In a similar manner the second stage comprising FET 18 and network 12 will generate at its output a pair of pulses comprising the input pulses (54) and an additional pair of pulses caused by the reflection of the open ended stub 13a generating thereby four pulses 55. Similarly, the third network 14 produces eight pulses 56 in a similar manner. As indicated above, the FET amplifiers are used to compensate for the factor-of-two loss in each network and to furthermore isolate reflections and thus eliminate the need of large delay lines between the networks. The final pulse train 56 will not have pulse widths as narrow as the input pulse 48 due to dispersion in the transmission lines and frequency response problems usually attendent such amplifiers. The minimum width of pulses 56 is primarily determined by the frequency response of the amplifier, and, more particularly, the time constant of the gate-to-ground circuit. In order to provide a narrow width pulse for the pulses of train 56, a step recovery diode (SRD) circuit 60 is preferred to sharpen the width of such output pulse trains. Suitable step recovery diode circuits are described in "Pulse and Waveform Generation with Step Recovery Diodes," Hewlett Packard Application Note 918.

By providing an additional stage wherein the network has an open ended stub of length $8 L_1$, a pulse burst generator is constructed to provide 16 pulses. The width or duration of each pulse can be made to be 100 to 200 picoseconds by using the step recovery diode sharpening circuits on the output burst. The period T, i.e., the nominal spacing between each pulse of a pulse train can be made to be one nanosecond using the design relations given hereinbefore. In one embodiment wherein a pulse train 75 was generated as illustrated in FIG. 2, by sharpening the pulses 56 with a conventional step recovery diode (SRD) circuit, the design parameters are as follows:

$L_1 = 5.84$ cm.
$L_2 = 2.54$ cm.
$V = 1.17 \times 10^{10}$ cm./sec.
$Z_0 = 91.6$ ohms
$R_G = 92$ ohms
$R_L = 120$ ohms
RCA - MESFET - type-MTC-T825
$R_{IN}$ and $R_{OUT}$ matched to the respective input and output impedances The elapsed time of such a pulse burst 75 is 7.7 nanoseconds, the amplitude of the first pulse being about 0.4 volts. There is a pulse spacing of 1.1 nanoseconds between pulses, the maximum half-height-pulse duration (e.g., 76, FIG. 2) being 225 picoseconds.

It will now be appreciated that according to the principles of the present invention, the insertion loss introduced by each transmission line network (10, 12, 14, etc) is substantially a function of the amount of impedance mismatch due to the presence of the stub and the resistive loss of each main transmission line (e.g., 25).

In the preferred embodiment, the mismatch manifested by the stub is thus inherently a factor of two since the voltage reflection coefficient is one half. However, the insertion loss due to the resistance of the main transmission line portion of the network is significantly reduced by the short lengths of the respective portions. These lengths can be kept relatively short since the match of the external circuit impedances to the characteristic impedance of the main transmissiom line (25) minimizes if not eliminates reflections.

While the embodiment of the invention is described to generate a digital pulse train wherein each of the desired pulses, 57, 58, 59, etc., is of one polarity, it will be appreciated that the invention may be used to generate radio frequency (RF) signals at frequencies in the gigahertz range. Such a generator may be implemented as shown in FIG. 4. A transmission line network 80 similar to networks 10, 12, and 14 has a stub portion 82 of length $L_1/2$ and shorted to ground at its end. The input train 56 from terminal 52 and 53 of the generator of FIG. 1 is coupled to a FET 84, similar to FETs 16, 18, and 20 which, in turn, are coupled to transmission line network 80. The network will generate a signal 86 across resistor 85 at terminals 87 and 88 having eight RF cycles with a period of T. T may be one nanosecond representing a frequency of one gigahertz.

The portions 26, 13a, and 15a are shown to be seemingly linear in appearance. In order to achieve a compacted structure, it should be appreciated that these stubs are in practice formed in a non-linear pattern as described in the aforementioned report by Curtice. As indicated above, the transmission line network that may be used in the practice of the present invention may take on several forms including coaxial cables, waveguides and the like. As known in the art there is a class of transmission line networks known as strip transmission lines. The term "strip transmission line" refers to that form of open transmission line which includes a substrate of dielectric material with a narrow conductive strip and a substantially wider ground conductor disposed on the substrate. The strip transmission line may be in either (i) the asymmetrical configuration, called a "microstrip," using a single ground plane on one side of the substrate and a narrow conductive strip on the opposite side of the substrate, (ii) the symmetrical configuration, commonly called a "stripline," having two ground planes on opposite sides of a narrow conductive strip, each ground plane being spaced from the narrow strip by a dielectric layer, or (iii) a surface strip transmission line (now also known as a coplanar waveguide) configuration described by C. P. Wen in the IEEE 1969 G-MTT (Group on Microwave Theory and Techniques) International Microwave Symposium Digest, May 1969, under the title of "A Surface Strip Transmission Line for Nonreciprocal Gyromagnetic Device Applications." In the surface strip transmission line configuration, the narrow conductor is spaced a short distance from the wider conductor and both are on the same surface of the dielectric substrate.

Furthermore, while the embodiment described hereinabove utilizes a single stub (26, etc.) in the network, the invention may be practiced using a second open-ended stub connected to the midpoint of the transmission line such that two stubs are thus joined to the main transmission at the same point. However, the characteristic impedance of each stub of such pair of stubs is made equal to the characteristic impedance ($Z_0$) of the transmission line (25). The length of each such stub, furthermore, is the same as the length of a single stub as described above. It will be appreciated that the operation of such a pair of stubs provide an equivalent number of pulses in response to the excitation or input pulse.

It will be appreciated by those skilled in the art, that a grounded stub may be used to produce an output pulse train having pulses of both polarities wherein essentially the polarity of the input pulses to each network will be replicated in the output of the network and another set of pulses will follow of opposite polarity.

It wil now be appreciated that the circuit of the present invention generates a train of pulses or RF signals in response to an input pulse that are multiplied by a factor of two ($2^n$) in each of a series of $n$ cascaded stages. The impedance relationship of the transistors and networks of each stage are such as to minimize reflections and, because of the reduced length of the transmission line, to reduce insertion loss effects. The spacing between the pulses or cycles is determined by the length of the stub.

What is claimed is:

1. A circuit for generating a signal consisting of a train of waveforms having a selected period from an input signal pulse, comprising:

transistor amplifier means including a transistor having input terminals and output terminals, said transistor having an input impedance and an output impedance exhibited, respectively, across said input and output terminals, network means including a transmission line and a stub, impedance means coupling the output terminals of said transistor to said network means, the characteristic impedance of said transmission line being substantially equal to the impedance of said impedance means, whereby, in response to said input signal pulse, a train of waveforms are generated by said network, said stub having a length to effect said desired period of said waveforms.

2. A circuit for generating a signal consisting of a train of waveforms in response to an input signal pulse generated by a source having a source impedance, comprising:

transistor amplifier means including a transistor having input terminals and output terminals, said transistor having an input impedance and an output impedance exhibited, respectively, across said input and output terminals, coupling means coupling said source to said transistor input terminal means and including impedance means matched to said source impedance, network means coupled to said transistor output terminals including a transmission line and a stub, said transmission line comprising two joined portions, said stub being connected only to the junction of said two transmission line portions, said stub having a predetermined length for controlling the reflection time of pulses conducted therein, whereby said stub serves as an open-ended transmission line, said transmission line having a characteristic impedance that effects a gain of said amplifier means greater than the insertion loss of said network means, said insertion loss of said network comprising the insertion loss due to the inherent mismatch caused by said stub and the resistive loss caused by said transmission line, said network means having input terminals including one end of one of said transmission line portions coupled to said transistor output terminals, and output terminals including one end of the other of said transmission line portions, whereby, in response to said input signal pulse, a train of waveforms are generated at the network means output terminals.

3. A circuit according to claim 2 comprising a plurality of said transistor amplifier means and said network means connected in cascade whereby the output terminals of each respective network means is coupled to a respective one of the input terminals of said transistor means, the length of each stub being selected such that the length of said stub is greater by a factor of two than the length of the stub of the immediate preceding network means, whereby the waveforms are pulses, the number of output pulses from the output terminals of the highest order network means being $2^n$, where $n$ is the number of said cascaded network means.

4. A circuit according to claim 3 wherein the spacing between said output pulses is $2 L_1 V$, when $L_1$ is the length of the stub of the lowest order network means, and $V$ is the velocity of a pulse on said stub.

5. A circuit according to claim 4 wherein the length ($L_2$) of each of said transmission line portions is $L_2 \approx VT/4$, where $V$ is the velocity of a pulse along said portions, and $T$ is the spacing between said pulses, whereby reflections that may occur will appear substantially midway between each of said plurality of pulses.

6. A circuit according to claim 3 further comprising:
another of said transistor means coupled to the output terminal of the highest order network means output terminals, and another network means coupled to said output terminals of said last-mentioned transistor means, the length of the stub of said another network means being one half the length of the stub of said first-mentioned stub and connected to ground, whereby, in response to said input signal pulse to said first-mentioned transistor amplifier means, a train of radio frequency waveforms is generated having the same spacing and number of cycles as the spacing and number of pulses generated at the output terminals of said highest order network means.

7. A circuit according to claim 2 wherein the characteristic impedance of said stub is one half the characteristic impedance of said transmission line.

8. A circuit according to claim 2 including a second stub connected to said junction of said two transmission line portions and the first mentioned stub, the characteristic impedance of both of said stubs being equal to the characteristic impedance of said transmission line.

9. A circuit according to claim 2 wherein said transistor to network coupling means includes a load resistor in shunt with the transistor output impedance, the parallel impedance value of said load resistor and said impedance of said transistor being substantially equal to the characteristic impedance of said transmission line, whereby signal reflection from said transmission line back to said transistor amplifier means are minimized.

10. A circuit according to claim 3 including a resistor shunting said input termials of each transistor following a respective networks means, the value of said resistor being substantially equal to the characteristic impedance of said transmission line whereby signal reflections from said amplifier means back to the preceding network means are substantially minimized.

11. A circuit according to claim 2 wherein said transmission line is a strip transmission line.

12. A circuit according to claim 11 wherein said strip transmission line is a microstrip transmission line.

13. A circuit according to claim 11 wherein said strip transmission line is a stripline transmission line.

14. A circuit according to claim 11 wherein said strip transmission line is a coplanar waveguide.

15. A circuit as set forth in claim 1, wherein said stub is open-circuited at its free end.

16. A circuit as set forth in claim 1, wherein said stub is short-circuited at its free end.

17. A circuit as set forth in claim 1, wherein said transistor comprises a MESFET.

18. A circuit for translating an input pulse to a train of pulses spaced equal time periods $T$ from one another comprising, in combination:

a plurality of stages, each having an input terminal and an output terminal, each stage except the last connected at its output terminal to the input terminal of the following stage, each stage for translating the $2^j$ pulses received at its input terminal to $2(j+1)$ serially occurring pulses at its output terminal, adjacent ones of which pulses are spaced a period $T$ from one another, where $j$ has successively higher integral values at each succeeding stage, each such value differing from the preceding value by one, means for applying $2^k$ input pulses to the input terminal of said first stage, where $k$ is the lowest value of $j$, and amplifier means receptive of the $2^j$ pulses applied to that stage for applying the same to said transmission line means at an amplified level sufficient to substantially compensate for losses which occur in the transmission line means.

19. A circuit as set forth in claim 18, wherein each stage comprises:
transmission line means which includes a first section for transmitting a pulse it receives and a second section responsive to a pulse it receives for generating a second pulse which is delayed relative to the transmitted pulses, each such transmission line means including means for inserting twice the delay between the transmitted and generated pulses as the transmission line means in the preceding stage.

20. A circuit as set forth in claim 19, wherein each transmission line means comprises a T shaped configuration line section, the upper portion of the T comprising a length of transmission line and the remainder of the T a transmission line stub, the stub of each stage being double the length of the stub of the preceding stage.

21. A circuit as set forth in claim 20, wherein said stub is open-circuited at its free end.

22. A circuit as set forth in claim 20, wherein said stub is short-circuited at its free end.

* * * * *